(12) United States Patent
Hanson et al.

(10) Patent No.: US 10,013,006 B2
(45) Date of Patent: Jul. 3, 2018

(54) LOW POWER TUNABLE REFERENCE VOLTAGE GENERATOR

(75) Inventors: Scott Hanson, Austin, TX (US);
Kenneth Gozie Ifesinachukwu, Austin, TX (US); Ajaykumar A. Kanji, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 899 days.

(21) Appl. No.: 14/342,189

(22) PCT Filed: Jun. 29, 2012

(86) PCT No.: PCT/US2012/045113
§ 371 (c)(1),
(2), (4) Date: Feb. 28, 2014

(87) PCT Pub. No.: WO2013/006493
PCT Pub. Date: Jan. 10, 2013

(65) Prior Publication Data
US 2014/0312876 A1 Oct. 23, 2014

Related U.S. Application Data

(60) Provisional application No. 61/504,223, filed on Jul. 3, 2011.

(51) Int. Cl.
*G05F 1/46* (2006.01)
*G06F 1/08* (2006.01)
(Continued)

(52) U.S. Cl.
CPC ............... *G05F 1/462* (2013.01); *G05F 3/08* (2013.01); *G06F 1/08* (2013.01); *G06F 1/10* (2013.01);
(Continued)

(58) Field of Classification Search
CPC . G05F 1/461; G05F 1/462; G05F 3/08; G05F 3/24; G05F 3/26; G05F 3/262;
(Continued)

(56) References Cited

U.S. PATENT DOCUMENTS 5,998,983 A * 12/1999 Gerber ................. G05F 1/465
323/313
6,737,909 B2 * 5/2004 Jaussi .................. G01R 35/007
327/541

(Continued)

*Primary Examiner* — Matthew Nguyen
(74) *Attorney, Agent, or Firm* — Hunt Pennington Kumar & Dula, PLLC; Artie Pennington; Jeffrey Van Myers

(57) ABSTRACT

A method and apparatus for generating an improved reference voltage for use, for example, in a system requiring accurate low power operation. In particular, our reference voltage generator is adapted to output VREF as a function of the voltage difference between V1 and V2. The reference voltage generator is further adapted to include our reference voltage tuner to compensate for predetermined sensitivities of the reference voltage VREF, and to adjust the absolute value of VREF. During manufacturing and system test, a driver may be used to drive a buffered or unbuffered version of VREF to off-chip test functionality. Also, a configuration memory may be used to store the trim settings during normal operation, and make such settings available to outside resources.

13 Claims, 6 Drawing Sheets

(51) Int. Cl.
*G06F 1/10* (2006.01)
*H03K 21/02* (2006.01)
*H03K 23/50* (2006.01)
*H03K 3/012* (2006.01)
*G05F 3/08* (2006.01)

(52) U.S. Cl.
CPC ........... *H03K 3/012* (2013.01); *H03K 21/023* (2013.01); *H03K 23/50* (2013.01)

(58) Field of Classification Search
CPC ........... G06F 1/08; G06F 1/10; H03K 21/023; H03K 23/50; H03K 3/012
See application file for complete search history.

(56) References Cited

U.S. PATENT DOCUMENTS

| | | | |
|---|---|---|---|
| 7,102,342 B2* | 9/2006 | Kim | G05F 3/262 323/277 |
| 2006/0103451 A1* | 5/2006 | Lim | G05F 1/575 327/540 |
| 2014/0049243 A1* | 2/2014 | Huang | G11C 5/147 323/312 |

* cited by examiner

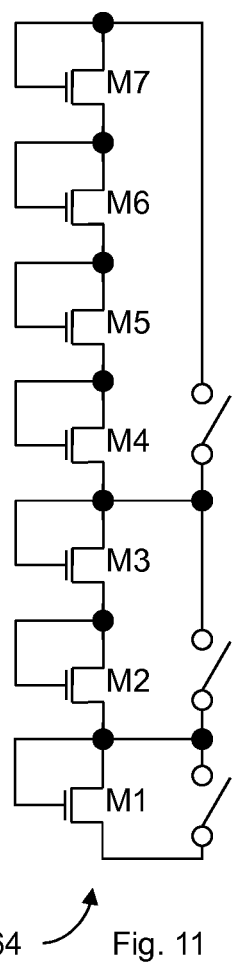
64 Fig. 11

LOW POWER TUNABLE REFERENCE VOLTAGE GENERATOR

CROSS-REFERENCE TO RELATED APPLICATIONS

This application claims priority to U.S. Provisional Application Ser. No. 61/504,223 filed 3 Jul. 2011 ("Parent Provisional"), and hereby claims benefit of the filing dates thereof pursuant to 37 CFR § 1.78(a)(4). The subject matter of the Parent Provisional, in its entirety, is expressly incorporated herein by reference.

This application is also related to the pending U.S. application Ser. No. 12/823,160, filed on 25 Jun. 2010 by the Regents of the University of Michigan, and to the pending U.S. application Ser. No. 13/472,870, filed on 16 May 2012 by the Regents of the University of Michigan (collectively, "Related Applications"). The subject matter of the Related Applications, in their entirety, is expressly incorporated herein by reference.

This application is related to application Ser. No. 14/342,177, filed simultaneously herewith on 28 Feb. 2018 ("Related Co-application"). The subject matter of the Related Co-application, in its entirety, is expressly incorporated herein by reference.

FIELD OF THE INVENTION

The present invention relates generally to reference voltage circuits used in integrated circuits, and, in particular, to low power reference voltage circuits.

BACKGROUND OF THE INVENTION

In general, in the descriptions that follow, we will italicize the first occurrence of each special term of art that should be familiar to those skilled in the art of integrated circuits ("ICs") and systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Generally, the high power consumption of current integrated circuit technology has become a critical problem for mobile electronics that must run for days, months, or even years on a single battery charge. As is known, a reference voltage generator is a key element in the overall design of integrated circuits. Such a reference voltage generator is typically used to provide a stable reference voltage to the analog modules of the integrated circuit.

Shown in FIG. 1 is a typical integrated system 10 comprising, inter alia, reference voltage ("$V_{REF}$") generator 12, reference current ("$I_{REF}$") generator 14, several digital modules, and several analog modules. An example of an analog module is analog to digital converter ("ADC") 16. Reference voltage generator 12 and reference current generator 14 are each common modules for supplying a stable reference to such analog modules. Reference voltage generator 12 is sometimes used to derive the output reference current provided by reference current generator 14. Also, reference voltage generator 12 and reference current generator 14 may be used to supply a stable reference to modules throughout integrated system 10.

Shown in FIG. 2 are three typical reference voltage generator configurations, 12A, 12B, and 12C, as discussed both in our Parent Provisional and in the Related Application. For such configurations, post-silicon trimming circuitry ("trimmer", not shown) is typically required to adjust for operational variations and fluctuations of MOSFET M1 and MOSFET M2, and subsequently, the absolute value of reference voltage ("$V_{REF}$"). As is known, the electrical characteristics of M1 and M2 are strongly influenced, at a minimum, by manufacturing variations and temperature variations. For the configurations illustrated in FIG. 2, the trimmer may not be adequate to compensate for such variations as desired.

As is known, semiconductor IC designs are generally sensitive, during normal operation, to variations in process, voltage and temperature ("PVT"). Such variations are expected, though not desired, and are a natural product of semiconductor manufacturing. During an IC design phase, conventional computer-aided design ("CAD"), computer-aided engineering ("CAE"), and computer-aided manufacturing ("CAM") software programs enable an IC development team to design an IC while also helping to predict circuit variations and circuit sensitivities. However, if the development team and associated software programs fail to predict all sensitivities, the manufacturing process will fabricate a certain number of ICs that do not meet data sheet specifications. Off-chip test equipment will generally determine such sensitivities, but the development team must subsequently spend valuable time to debug and modify the IC. As is known, when the manufacturing process fabricates ICs below a predicted yield the result is lost revenue opportunity.

Due to sub-micron feature sizes, in addition to strict power consumption and operation requirements, reference voltage generator designs may be especially susceptible to PVT. As explained in, for example, the text book of David A. Johns and Ken Martin, entitled "Analog Integrated Circuit Design", Wiley, pg. 360, 1997, a copy of which is submitted herewith and incorporated herein in its entirety by reference, and as illustrated in FIG. 2, certain circuits, such as bandgap reference voltage generator 12D, and the like, are known to provide a more stable reference voltage across PVT; however such circuits consume significantly more power than other reference voltage generators. Some voltage reference generators, such as reference voltage generators 12A, 12B, and 12C illustrated in FIG. 2, consume much less power; however such voltage reference generators have significantly more sensitivity to PVT than bandgap voltage references and the like.

As discussed in our Parent Provisional, we submit what is needed is an improved method and apparatus for a reference voltage generator that provides optimized power consumption, resulting in extended battery life, reduced battery size, and reduced cost. In particular, we submit such a method and apparatus for a reference voltage generator should provide an improved solution for low power supply requirements, while also providing an improved topology for trimming out PVT sensitivities. Also, the characteristics of the reference voltage generator should be controllable and observable in a manufacturing and system test environment.

BRIEF SUMMARY OF THE INVENTION

In accordance with the preferred embodiment of our invention, we provide a trimmable reference voltage generator comprising a reference voltage generator adapted to develop a first reference voltage $V_{OUT}$; and a variable gain amplifier, coupled to the reference voltage generator, adapted to receive $V_{OUT}$ and to develop a second reference voltage $V_{REF}$ as a predetermined function of $V_{OUT}$.

We also provide a method we prefer for trimming a reference voltage $V_{REF}$. Generally, the steps comprise developing a first reference voltage $V_{OUT}$; and developing a second reference voltage $V_{REF}$ as a predetermined function of $V_{OUT}$.

BRIEF DESCRIPTION OF THE SEVERAL VIEWS OF THE DRAWINGS

Our invention may be more fully understood by a description of certain preferred embodiments in conjunction with the attached drawings in which:

FIG. 11 illustrates, in schematic diagram form, an example of a variable divider constructed in accordance with various embodiments of our invention.

Figure 1:
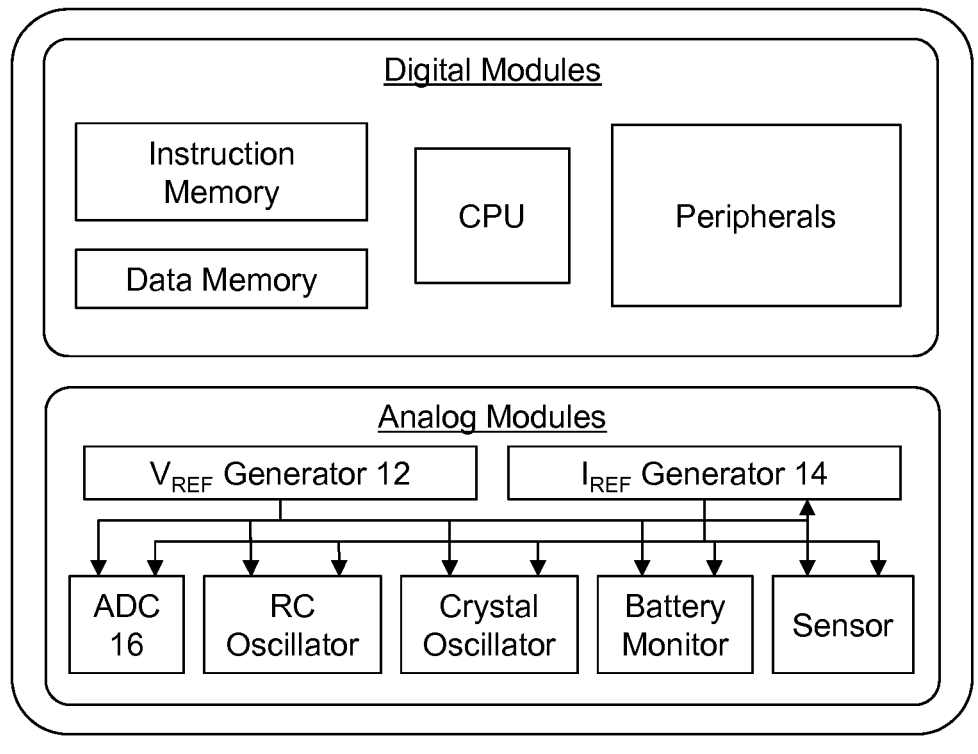
FIG. 1 illustrates, in block diagram form, a typical integrated system.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Figure 3:
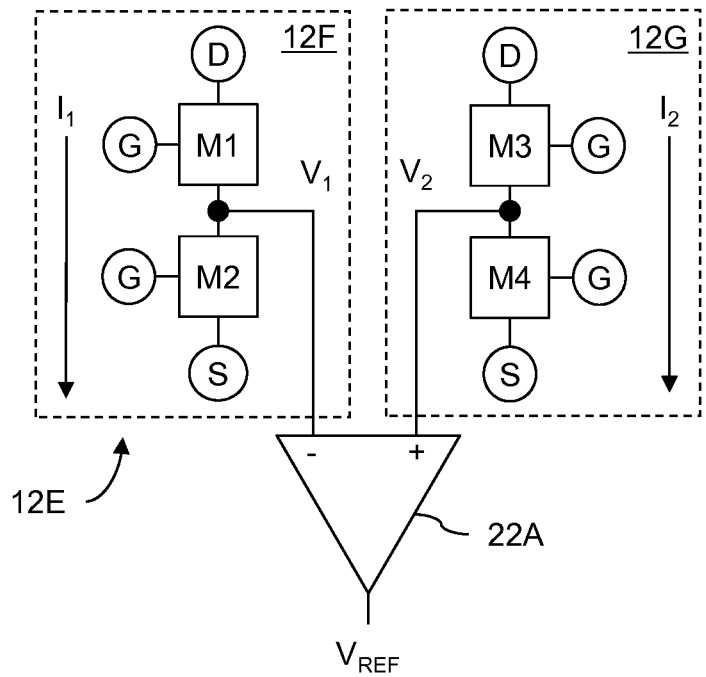
FIG. 3 illustrates, in block diagram form, a reference voltage generator constructed in accordance with our invention.
Figure 4:
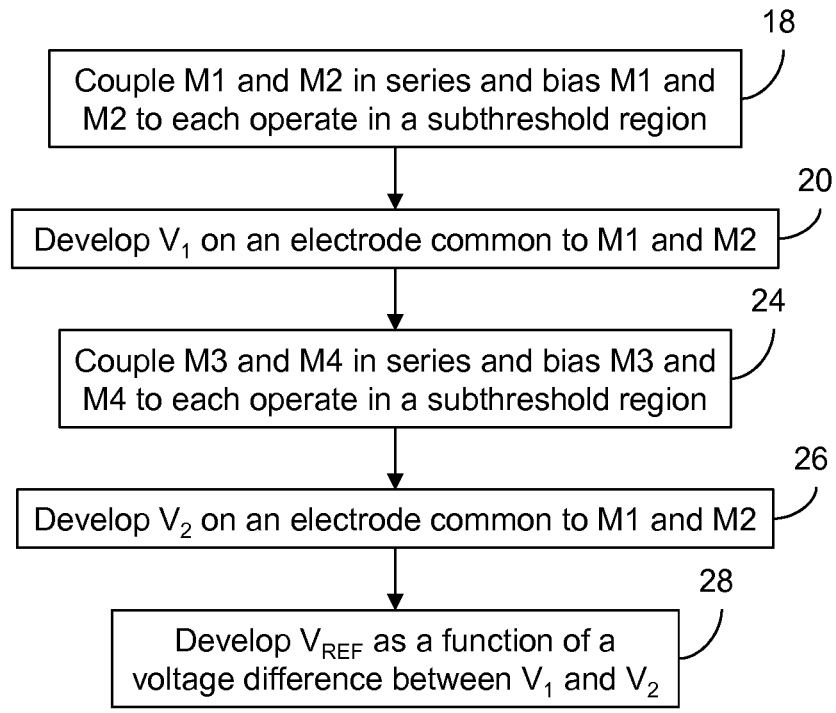
FIG. 4 illustrates, in flow diagram form, the sequencing of the operations in the reference voltage generator of FIG. 3.

Shown in FIG. 3, by way of example, is our reference voltage generator 12E, constructed in accordance with our invention; and in FIG. 4 is an exemplary method for the sequencing of the operations of reference voltage generator 12E. In general, for such an arrangement, series-coupled MOSFET transistors, M1 and M2, of a reference voltage generator 12F ("VR 12F") are each biased in the subthreshold region (step 18) to develop a first output voltage ("$V_1$") on an electrode common to M1 and M2 (step 20). In general, a transistor biased in the subthreshold region is defined by the well known relationship, where the absolute value of the gate-to-source voltage ("$V_{GS}$") of the transistor is less than the absolute value of the threshold voltage ("$V_{th}$") of the transistor:

$$|V_{GS}| < |V_{th}| \qquad [\text{Eq. 1}]$$

Also, series-coupled MOSFET transistors, M3 and M4, of a reference voltage generator 12G ("VR 12G") are each biased in the subthreshold region (step 24) to develop a second output voltage ("$V_2$") on an electrode common to M3 and M4 (step 26). A difference amplifier 22A develops an output reference voltage, $V_{REF}$, as a function of the voltage difference between $V_1$ and $V_2$ (step 28). The electrical parameters of VR 12F and VR 12G may be tuned such that $V_{REF}$ is proportional-to-absolute temperature ("PTAT"), or complementary-to-absolute temperature ("CTAT").

In alternate embodiments, the series-coupled MOSFET transistor circuits of VR 12F and VR 12G may each be designed using various transistor types and gate, drain, source, and bulk electrode connections. In general, it is known that a variety of bulk electrode connections are possible, for example, when a transistor is biased in the subthreshold region. As examples, the bulk electrode may be coupled to the source electrode, the drain electrode, ground, a supply voltage, or a circuit node. Since typical integrated circuit design uses a common bulk electrode for same type transistors, we have chosen to simplify our disclosure by not further discussing the variety of known possible bulk electrode connections.

In general, MOSFETs M1, M2, M3, and M4 may each be individually manufactured as an N-channel MOSFET or a P-channel MOSFET. Those skilled in the art will appreciate that gate electrode ("G"), drain electrode ("D"), and source electrode ("S") for each transistor of reference voltage generator 12E may each be coupled, for example, to a bias voltage, a positive supply voltage, or ground, providing the respective transistor is biased in the subthreshold region. If desired, different $V_{th}$ values may be manufactured for M1, M2, M3, and M4 through various approaches, for example, by using a predetermined combination of doping implants, gate width sizes, gate length sizes, and bias voltages of the substrate and wells. Various alternate topologies that apply to VR 12F and VR 12G are discussed, for example, in the Related Application. Also, those skilled in the art of integrated circuits will recognize that difference amplifier 22A may be implemented using various hardware circuits and software algorithms. As discussed in our various embodiments, a difference amplifier is not restricted to any specific circuit structure.

Figure 5:
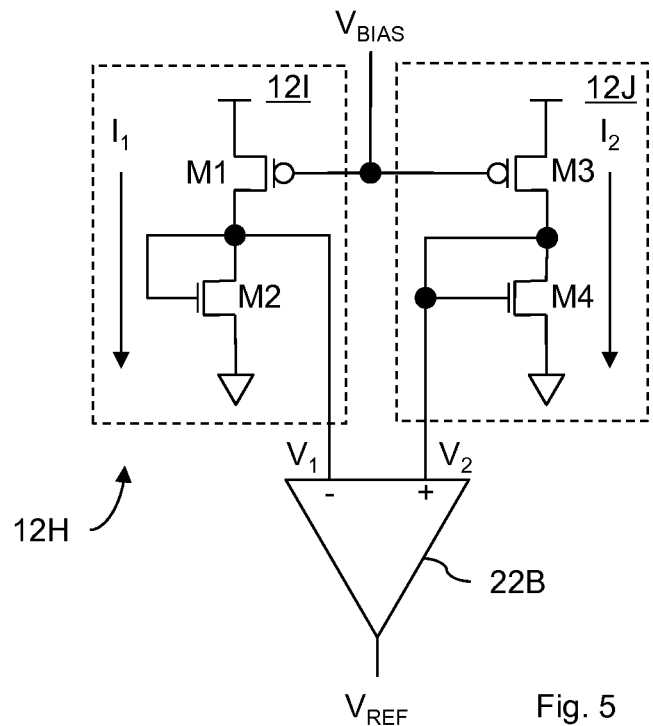
FIG. 5 illustrates, in schematic diagram form, a reference voltage generator constructed in accordance with one embodiment of our invention.

Shown in FIG. 5, by way of example, is our reference voltage generator 12H, constructed in accordance with one embodiment of our invention. In general, for such an arrangement, the series-coupled MOSFET transistors, P-channel M1 and N-channel M2, of VR 12I are each biased in the subthreshold region to develop a first output voltage, $V_1$. Also, P-channel M3 and N-channel M4, of VR 12J, are each biased in the subthreshold region to develop a second output voltage, $V_2$. For reference voltage generator 12H, the current $I_1$ of VR 12I and the current $I_2$ of VR 12J are constrained to be proportional to one another by coupling the gate electrodes of M1 and M3, respectively, to a selected bias voltage, $V_{BIAS}$. Difference amplifier 22B develops $V_{REF}$ as a function of the voltage difference between $V_1$ and $V_2$. In this configuration, the electrical parameters of VR 12I and VR 12J may be selectively tuned such that $V_{REF}$ is substantially temperature insensitive, PTAT, or CTAT.

By way of example, N-channel transistors M2 and M4 are each biased in the subthreshold region by coupling the gate electrode of each to the respective drain electrode. Also, P-channel transistors M1 and M3 are each biased in the subthreshold region by applying a predetermined $V_{BIAS}$ to the gate electrode. Using a current mirror principle, the current $I_1$ of VR 12I and the current $I_2$ of VR 12J are constrained to be proportional to one another. Note that the values of $I_1$ and $I_2$ are not constrained to equal one another, and can be skewed by a predetermined multiple. For example, $I_1$ may be two times larger than $I_2$. Typically, M2 and M4 will be manufactured with different $V_{th}$ values. As previously discussed, different $V_{th}$ values may be achieved for M2 and M4 using various manufacturing and transistor geometry techniques. Note that the use of different doping implants typically results in significant post-manufacturing variation since the doping levels of different implants will vary in an uncorrelated manner. This variation may be minimized by manufacturing the transistors with substantially identical implants. Finally, although $V_1$ and $V_2$ may each be used as independent reference voltages, using $V_{REF}$ as the reference voltage for the integrated system is generally preferred since, as we will explain later, $V_{REF}$ has improved stability when compared to either $V_1$ or $V_2$.

As is well known, the current, $I_1$, through M2 and the current, $I_2$, through M4, when both are biased in the subthreshold region, and when the drain to source voltage ("$V_{DS}$") is greater than 3 times the thermal voltage ("$vT$"), is given by equations 2 and 3, respectively:

$$I_1 = K_2 e^{\frac{V_1 - V_{th,2}}{m_2 vT}} \quad [\text{Eq. 2}]$$

$$I_2 = K_4 e^{\frac{V_2 - V_{th,4}}{m_4 vT}} \quad [\text{Eq. 3}]$$

where: $Ki(i=1, 2, \ldots)$=a function of transistor dimensions, mobility, and temperature;
$Vth,i(i=1, 2, \ldots)$=the threshold voltage of device $Mi(i=1, 2, \ldots)$;
$mi(i=1, 2, \ldots)$=the subthreshold slope factor for $Mi(i=1, 2, \ldots)$; and
$vT$=the thermal voltage, which is a function of temperature.

If the associated P-channel MOSFETs M1 and M3 of VR 12I and VR 12J, are manufactured substantially similar, $I_1$ and $I_2$ may be set equal, as shown in Equation 4. As is known, $I_1$ and $I_2$ may also be multiples of one another for various sizes of M1 and M3. For example, if the width of M1 is 3 times larger than the width of M3, it follows that, in general, $I_1$ will be 3 times larger than $I_2$.

$$K_2 e^{\frac{V_1 - V_{th,2}}{m_2 vT}} = K_4 e^{\frac{V_2 - V_{th,4}}{m_4 vT}} \quad [\text{Eq. 4}]$$

As is known, by taking the logarithm ("ln") of both sides of equation 4, where: $\ln e^x = x \ln e$, $\ln e = 1$, and $\ln xy = \ln x + \ln y$, equation 6 may be derived from equation 5 as:

$$m_4 vT \ln\left(\frac{K_2}{K_4}\right) + \frac{m_4}{m_2} V_1 - \frac{m_4}{m_2} V_{th,2} = V_2 - V_{th,4} \quad [\text{Eq. 5}]$$

$$V_2 - \frac{m_4}{m_2} V_1 = V_{th,4} - \frac{m_4}{m_2} V_{th,2} + m_4 vT \ln\left(\frac{K_2}{K_4}\right) \quad [\text{Eq. 6}]$$

Referring to equation 6, it can be seen that $V_{REF}$ is a function of $$V_2 - \frac{m_4}{m_2} V_1.$$

If we further approximate that the subthreshold slope factors, $m_2$ and $m_4$, are equivalent, then the relationship simplifies to:

$$V_2 - V_1 = V_{th,4} - V_{th,2} + m_4 vT \ln\left(\frac{K_2}{K_4}\right) \quad [\text{Eq. 7}]$$

$V_{REF}$, which is proportional to $V_2 - V_1$, may be made substantially temperature-insensitive, PTAT, or CTAT by tuning parameters $K_2$ and $K_4$. Also, the temperature dependency of $K_2$ and $K_4$ are substantially the same and consequently these terms will cancel.

As is known, in alternate embodiments, the series-coupled MOSFET transistor circuit of VR 12I and VR 12J may each be designed using various transistor types and gate, drain, source, and bulk electrode connections, resulting in slightly modified equations.

Figure 2:
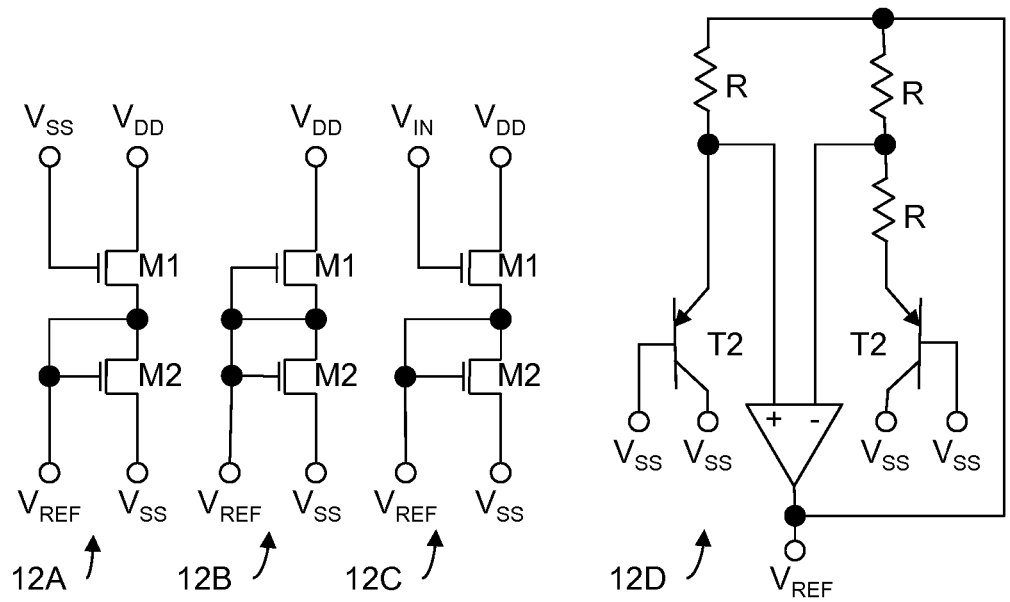
FIG. 2 illustrates, in schematic diagram form, four prior art reference voltage generators.

The difference topology of reference voltage generator 12H is advantageous. For example, M2 and M4 may be designed using transistors with substantially the same doping implants. Such a topology achieves a significantly reduced sensitivity to PVT variations when compared to the circuit topologies 12A, 12B, and 12C of FIG. 2.

Figure 6:
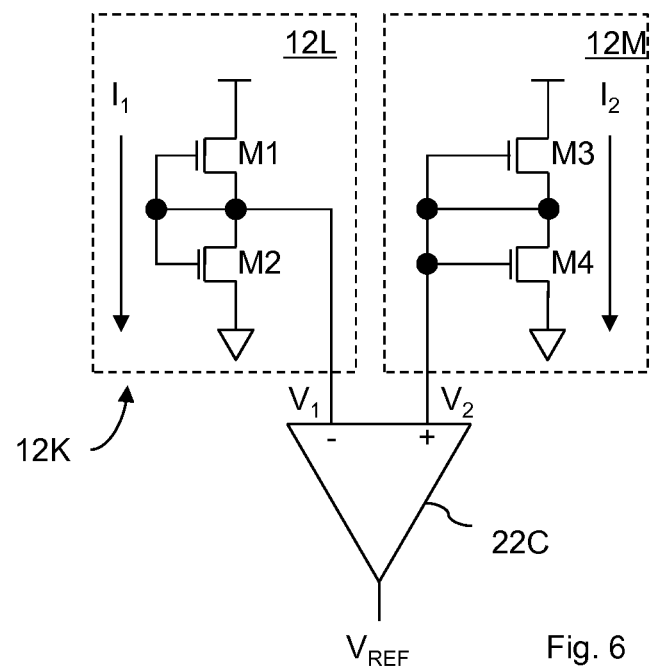
FIG. 6 illustrates, in schematic diagram form, a reference voltage generator constructed in accordance with another embodiment of our invention.

Shown in FIG. 6, is our reference voltage generator 12K, constructed in accordance with another embodiment of our invention. In general, for such an arrangement, the series-coupled MOSFET transistors, N-channel M1 and N-channel M2, of VR 12L, are each biased in the subthreshold region to develop a first output voltage, $V_1$. Also, N-channel M3 and N-channel M4 of VR 12M are each biased in the subthreshold region to develop a second output voltage, $V_2$. For reference voltage generator 12K, the operational current of VR 12L, $I_1$, is independent of the operational current of VR 12M, $I_2$. Reference voltage generator 12K develops $V_{REF}$ as a function of the voltage difference between $V_1$ and $V_2$. The electrical parameters of VR 12L and VR 12M may be selectively tuned such that $V_{REF}$ is substantially temperature insensitive, PTAT, or CTAT.

Referring again to reference voltage generator 12K, transistors M2 and M4 are each biased in the subthreshold region by coupling the gate electrode of each to the respective drain electrode. Also, transistors M1 and M3 are each biased in the subthreshold region by coupling the gate electrode of each to the respective source electrode. VR 12L and VR 12M operate such that $V_1$ and $V_2$ achieve a predetermined difference in voltage such that difference amplifier 22C may develop $V_{REF}$ as a function of the voltage difference between $V_1$ and $V_2$. Finally, although $V_1$ and $V_2$ may each be used as independent reference voltages, using $V_{REF}$ as the reference voltage for the integrated system 10 is generally preferred since, as we will explain later, $V_{REF}$ has improved stability when compared to either $V_1$ or $V_2$.

By way of example, for reference voltage generator 12K, M1 and M2 are each biased in the subthreshold region. As is known, the current $I_1$, associated with the series-coupled M1 and M2 is given by equations 8 and 9, respectively:

$$I_1 = K_1 e^{\frac{-V_{th,1}}{m_1 v_T}} \qquad [\text{Eq. 8}]$$

$$I_1 = K_2 e^{\frac{V_1 - V_{th,2}}{m_2 v_T}} \qquad [\text{Eq. 9}]$$

Current $I_1$, as represented by the right side of each equation, may be set equal to each other:

$$K_1 e^{\frac{-V_{th,1}}{m_1 v_T}} = K_2 e^{\frac{V_1 - V_{th,2}}{m_2 v_T}} \qquad [\text{Eq. 10}]$$

Once again, by taking the logarithm of both sides of equation 10, equation 13 may be derived as:

$$\ln\left(\frac{K_1}{K_2}\right) - \frac{V_{th,1}}{m_1 v_T} = \frac{V_1 - V_{th,2}}{m_2 v_T} \qquad [\text{Eq. 11}]$$

$$m_2 v_T \ln\left(\frac{K_1}{K_2}\right) - m_2 \bcancel{v_T} \frac{V_{th,1}}{m_1 \bcancel{v_T}} = V_1 - V_{th,2} \qquad [\text{Eq. 12}]$$

$$V_1 = V_{th,2} - \frac{m_2}{m_1} V_{th,1} + m_2 v_T \ln\left(\frac{K_1}{K_2}\right) \qquad [\text{Eq. 13}]$$

Subsequently, for $I_2$, the same approach may be used to derive $V_2$:

$$V_2 = V_{th,4} - \frac{m_4}{m_3} V_{th,3} + m_4 v_T \ln\left(\frac{K_3}{K_4}\right) \qquad [\text{Eq. 14}]$$

It can be seen, that the voltage difference between $V_1$ and $V_2$, which is proportional to $V_{REF}$, may be temperature-insensitive, PTAT, or CTAT by tuning parameters $K_1$, $K_2$, $K_3$, and $K_4$:

$$V_2 - V_1 = \qquad [\text{Eq. 15}]$$
$$V_{th,4} - \frac{m_4}{m_3} V_{th,3} - V_{th,2} + \frac{m_2}{m_1} V_{th,1} + m_4 v_T \ln\left(\frac{K_3}{K_4}\right) - m_2 v_T \ln\left(\frac{K_1}{K_2}\right)$$

As is known, in alternate embodiments, the series-coupled MOSFET transistor circuit of VR 12L and VR 12M may each be designed using various transistor types and gate, drain, source, and bulk electrode connections, resulting in slightly modified equations.

The difference topology of reference voltage generator 12K is advantageous, for example, where the same associated transistor types are manufactured for VR 12L and VR 12M. Such a topology achieves a significantly reduced sensitivity to PVT variations when compared to the circuit topologies of 12A, 12B, and 12C of FIG. 2.

Figure 7:
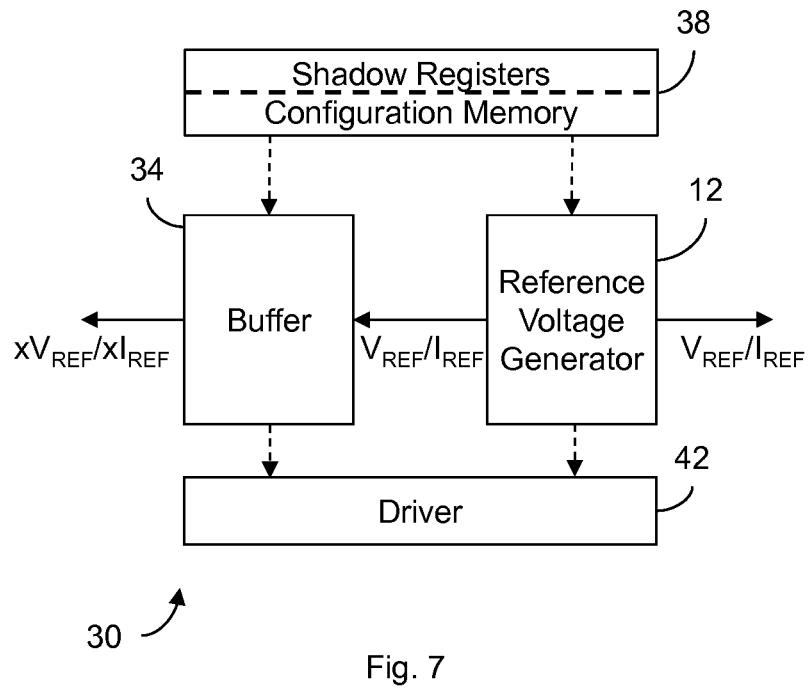
FIG. 7 illustrates, in block diagram form, a reference voltage generator system constructed in accordance with yet another embodiment of our invention.
Figure 8:
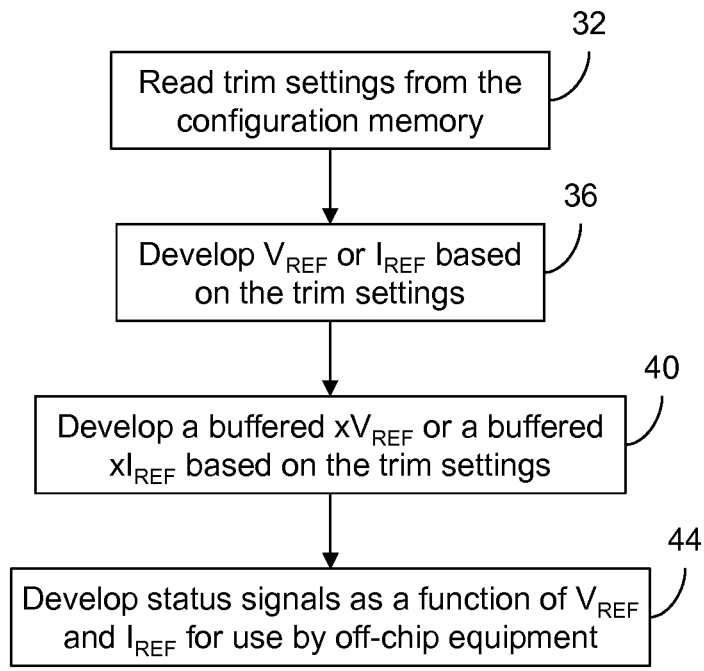
FIG. 8 illustrates, in flow diagram form, the sequencing of the operations in the reference voltage generator system of FIG. 7.

Shown in FIG. 7 is our reference voltage generator system 30, constructed in accordance with yet another embodiment of our invention; and in FIG. 8 is an exemplary method for the sequencing of the operations of reference voltage generator system 30. As preferred trim settings are determined for reference voltage generator 12, typically by off-chip test equipment, or, alternatively, by on-chip circuitry, the preferred trim settings may be subsequently provided to a configuration memory 38 for internal storage, (see, e.g. related co-application) and subsequently read by reference voltage generator 12 for operational use (step 32). Reference voltage generator 12 may develop $V_{REF}$ or $I_{REF}$, based on trim settings, using for example, a selected one of the reference voltage generator topologies illustrated in FIG. 2, FIG. 3, FIG. 5, and FIG. 6 (step 36). Alternately, any number of known, or yet to be invented, reference voltage generator 12 topologies, may be used to develop $V_{REF}$ or $I_{REF}$ (see, for example, $V_{REF}$, $I_1$, and $I_2$ of FIG. 3). Reference voltage generator 12 may include trimming capability, with a first control to compensate for predetermined sensitivities of the reference voltage $V_{REF}$, and a second control to adjust the absolute value of $V_{REF}$. Buffer 34 may receive the trim settings, and $V_{REF}$ or $I_{REF}$, and subsequently develop a buffered $xV_{REF}$ or a buffered $xI_{REF}$, based on the trim settings, for use by internal functions such as on-chip modules (step 40). Typically, to improve transient noise immunity, using the buffered $V_{REF}$ or the buffered $I_{REF}$ for internal functions is preferred.

During manufacturing and system test, driver 42 may be used to receive the unbuffered $V_{REF}$, the buffered $xV_{REF}$, the unbuffered $I_{REF}$, and the buffered $xI_{REF}$, and may subsequently provide signals as a function of $V_{REF}$ and $I_{REF}$ for use by off-chip equipment (step 44). Providing $V_{REF}$ to external functions, such as test equipment, provides a way to measure and subsequently determine preferred trim settings to be used by internal trimmer circuitry of reference voltage generator 12 (see, e.g. related co-application).

In one embodiment, buffer 34 may provide a buffered $V_{REF}$ using a unity gain amplifier.

In another embodiment, a common source amplifier and a current mirror may be included with reference voltage generator 12 to output a reference current ("$I_{REF}$") for distribution throughout the integrated system.

In yet another embodiment, driver 42 may include a multiplexing function so that a pad used to communicate a digital signal, an analog signal, or a power signal, during normal mode, may be used to measure the driven $V_{REF}$ or the driven $I_{REF}$ during a manufacturing or system test mode. In yet another embodiment, driver 42 may comprise a voltage-to-current converter or a current-to-voltage converter to accommodate test equipment which requires a current input, or a voltage input, respectively. For this example, $V_{REF}$ and $I_{REF}$ may be provided subsequent to a current-to-voltage conversion or a voltage-to-current conversion.

In yet another embodiment, during manufacture or system test, $V_{REF}$ or $I_{REF}$ may be read externally and adjusted iteratively until $V_{REF}$ or $I_{REF}$ have been trimmed to a predetermined value.

In still another embodiment, configuration memory 38 may comprise banks of registers, or alternate storage embodiments, comprising a plurality of configuration bits for storing the desired trim settings for the reference voltage generator 12. Configuration memory 38 may typically be implemented using non-volatile memory, although any known memory type, such as RAM, flash memory, and one-time programmable memory may be used.

Figure 9:
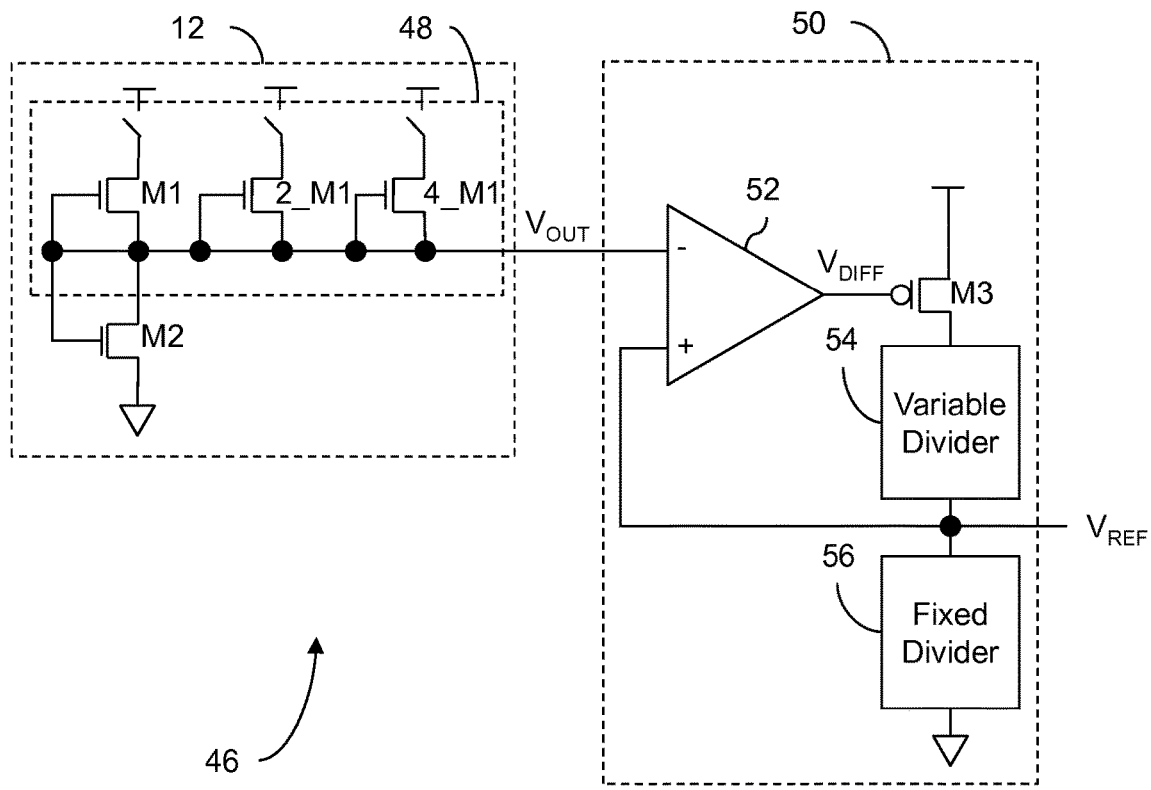
FIG. 9 illustrates, in schematic diagram form, a trimmable reference voltage generator with a first trimmer to compensate for predetermined sensitivities of the reference voltage, and a second trimmer to adjust the absolute value of the reference voltage.
Figure 10:
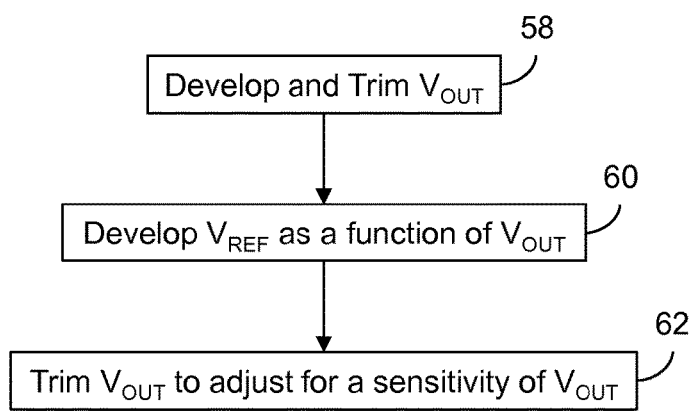
FIG. 10 illustrates, in flow diagram form, the sequencing of the operations of the trimmable reference voltage generator of FIG. 9.

Shown in FIG. 9, by way of example, is a trimmable reference voltage generator 46 constructed in accordance with another embodiment of our invention; and in FIG. 10 is an exemplary method for the sequencing of the operations of our trimmable reference voltage generator 46. Reference voltage generator 12 includes a sensitivity trimmer 48 adapted selectively to trim a first reference voltage, $V_{OUT}$, to adjust for predetermined circuit sensitivities, such as PVT sensitivities, of $V_{OUT}$. Programmable selectable N-channel transistors M1, 2_M1, and 4_M1 (collectively, "n_M1") are each coupled in parallel to one another, and are each biased to operate in a subthreshold region. As illustrated, $V_{OUT}$ is developed at the common electrode of parallel-connected transistors n_M1 and N-channel transistor M2.

Also shown is an example topology of a variable gain amplifier 50 adapted selectively to adjust and trim an absolute value of a second reference voltage, $V_{REF}$. An operational amplifier 52, coupled to receive $V_{REF}$, develops a voltage difference, $V_{DIFF}$, to drive the gate electrode of a P-channel transistor M3; a voltage divider, comprising a variable divider 54 and a fixed divider 56 develops $V_{REF}$ as a function of the resulting current through M3.

In alternate embodiments, $V_{REF}$ may be developed, for example, from a selected voltage node of variable voltage divider 54, a selected voltage node of fixed voltage divider 56, or from the drain electrode of transistor M3. Also, the topology of variable voltage divider 54 and fixed voltage divider 56 are shown by way of example. According to the invention, variable voltage divider 54 and fixed voltage divider 56 may be swapped, interleaved, or implemented in any topology that develops $V_{REF}$ as a selected fraction of the voltage developed at the source electrode of transistor M3.

During initialization (and, perhaps, at selected times thereafter), sensitivity trimmer 48 is adjusted to selectively trim $V_{OUT}$ to adjust for a predetermined sensitivity, such as a PVT sensitivity, of $V_{OUT}$ (step 58). Such a trim setting may be stored in configuration memory 38. The voltage regulator then develops a regulated voltage at the source electrode of transistor M3 as a function of a voltage difference between $V_{OUT}$ and $V_{REF}$. In general, the circuit topology of variable voltage divider 54 and fixed voltage divider 56 provides a variable gain feedback network that develops $V_{REF}$ as a function of the voltage developed at the source of transistor M3, so that $V_{REF}$ is adjusted to a value which is a function of $V_{OUT}$ (step 60). Selective trimming of the adjusted absolute value of $V_{REF}$ may be accomplished by programming, for example, a transistor configuration of the variable divider 54 (step 62). The trim setting for variable divider 54 may be stored in configuration memory 38. Using known techniques, either or both of the trim settings may be made available to resources external to the integrated system.

In alternate embodiments, $V_{OUT}$ may be provided using, for example, any selected one of the various reference voltage generator 12 topologies illustrated in FIG. 2, FIG. 3, FIG. 5, and FIG. 6. Alternately, any number of known, or yet to be invented, reference voltage generator topologies may be used to provide $V_{OUT}$.

In another embodiment, the one or more n_M1 transistors may use an alternate, non-binary weighting scheme.

In other embodiments, alternate configurations of trimming topologies may be used to trim $V_{REF}$, and to compensate for sensitivities.

Shown in FIG. 11, by way of example, is a diode stack 64. For power management, variable divider 54 and fixed divider 56 of FIG. 9 may be implemented using a plurality of diode-connected transistors collectively comprising a diode stack 64, where each transistor is biased in the subthreshold region. Such a diode stack 64 may include a selection of programmable transistors coupled in series by a binary weighting scheme. In yet another embodiment, variable divider 54 and fixed divider 56 may include other topologies, for example, a predetermined combination of resistor, capacitor, and transistor structures.

Thus it is apparent that we have provided an improved method and apparatus for our reference voltage generator, and, in particular, we submit that our method and apparatus provides optimized power consumption, resulting in extended battery life, reduced battery size, and reduced cost. In particular, we have provided an improved solution for low power supply requirements, while also providing an improved topology for trimming out PVT sensitivities. Also, we have provided for the characteristics of our reference voltage generator to be controllable and observable in a manufacturing and system test environment. Therefore, we intend that our invention encompass all such variations and modifications as fall within the scope of the appended claims.

What we claim is:

1. A tunable reference voltage generator comprising:
   a reference voltage generator adapted to develop a first reference voltage, said reference voltage generator comprising a sensitivity tuner adapted selectively to tune said first reference voltage to adjust for a predetermined sensitivity of said first reference voltage; and
   a variable gain amplifier, coupled to said reference voltage generator, adapted to receive said first reference voltage and to develop a second reference voltage as a predetermined function of said first reference voltage.

2. The tunable reference voltage generator of claim 1 wherein the sensitivity tuner is further characterized as comprising a programmable plurality of binary weighted transistors.

3. The tunable reference voltage generator of claim 1 wherein the reference voltage generator is further characterized as comprising:
   a first transistor, biased to operate in a subthreshold region; and
   a second transistor biased to operate in a subthreshold region, coupled in series with said first transistor so as to develop said first reference voltage on an electrode common to said first transistor and said second transistor.

4. The tunable reference voltage generator of claim 1 wherein the reference voltage generator is further characterized as comprising:
   a first transistor biased to operate in a subthreshold region;
   a second transistor biased to operate in a subthreshold region, coupled in series with said first resistor so as to develop a first reference voltage on an electrode common to said first transistor and said second transistor;
   a third transistor biased to operate in a subthreshold region;
   a fourth transistor biased to operate in a subthreshold region, coupled in series with said third resistor so as to develop a second reference voltage on an electrode common to said third resistor and said fourth resistor; and
   a difference amplifier adapted to develop the second reference voltage as a function of a voltage difference between the first reference voltage and the second reference voltage.

5. The tunable reference voltage generator of claim 1 wherein the reference voltage generator is further characterized as a bandgap voltage reference generator adapted to provide said first reference voltage.

6. The tunable reference voltage generator of claim 1 wherein the variable gain amplifier is further characterized as comprising:
   a difference amplifier adapted to:
      receive said first reference voltage and a function of said second reference voltage; and
      develop a difference voltage as a function of a voltage difference between said first reference voltage and a function of said second reference voltage; and
   a voltage divider adapted to:
      receive the difference voltage; and
      develop said second reference voltage as a function of the difference voltage.

7. The tunable reference voltage generator of claim 6 wherein the voltage divider is further characterized as comprising a variable divider coupled in series with a fixed divider, said variable divider adapted selectively to tune an absolute value of said second reference voltage.

8. The tunable reference voltage generator of claim 7 wherein the variable divider is further characterized as comprising a programmable plurality of transistors, each biased in the subthreshold region and coupled in series with each other in a diode stack topology.

9. A method for tuning a reference voltage, the method comprising the steps of:
   (1) developing a first reference voltage comprising:
      (1A) tuning said first reference voltage to adjust for a predetermined sensitivity of said first reference voltage; and
   (2) developing a second reference voltage as a predetermined function of said first reference voltage.

10. The method of claim 9 further characterized as:
   (1A1) programming a resistance, said resistance selected from a plurality of binary weighted increments; and
   (1A2) tuning said first reference voltage, as a function of said programmed resistance, to adjust for a predetermined sensitivity of said first reference voltage.

11. The method of claim 9 wherein step (2) is characterized as:
   (2A) developing a difference voltage as a function of a voltage difference between said first reference voltage and a function of said second reference voltage; and
   (2B) developing said second reference voltage as a function of the difference voltage.

12. The method of claim 9 further characterized as:
   (3) tuning said second reference voltage, as a function of a programmed resistance and a fixed resistance, to adjust for a predetermined sensitivity of said second reference voltage.

13. The method of claim 12 wherein said programmed resistance is further characterized as a function of a selected sum of forward biased diode voltage drops.

* * * * *